United States Patent [19]
Hayes et al.

[11] Patent Number: 5,990,693
[45] Date of Patent: Nov. 23, 1999

[54] TEST CONTACTOR

[75] Inventors: William John Hayes; Valts Edgars Treibergs; Jamie Black Doehrmann, all of South Bend, Ind.

[73] Assignee: Wells-CTI, South Bend, Ind.

[21] Appl. No.: 08/929,956

[22] Filed: Sep. 15, 1997

[51] Int. Cl.[6] .................................................. G01R 31/26
[52] U.S. Cl. ........................ 324/755; 324/757; 324/762
[58] Field of Search .................................. 324/754, 755, 324/757, 758, 762

[56] References Cited

U.S. PATENT DOCUMENTS

| | | | |
|---|---|---|---|
| 3,573,617 | 4/1971 | Randolph | 324/755 |
| 5,172,049 | 12/1992 | Kiyokawa et al. | 324/755 |
| 5,290,192 | 3/1994 | Espenshade et al. | 439/266 |
| 5,460,538 | 10/1995 | Ikeya | 439/331 |
| 5,504,436 | 4/1996 | Okutsu | 324/761 |
| 5,521,521 | 5/1996 | Perego | 324/755 |

*Primary Examiner*—Glenn W. Brown
*Attorney, Agent, or Firm*—Baker & Daniels

[57] ABSTRACT

A test contactor for establishing a releasable connection between terminals of an integrated circuit electronic module to be tested and a circuit board connected to test equipment includes a housing carrying a contact element for each terminal of the module. Each contact element includes a contact surface which is engaged by the corresponding terminal of the modules when testing is effected. The contact surface is connected to a pad which connects the contact element to the circuit board by a spring arm that is slidably engaged with the pad. Accordingly, as the contact element is deflected during testing, the spring arm slides along the pad, and the resiliency of the contact element restores itself it is initial condition when the module is removed. The spring arm provides the shortest possible electrical path between the contact surface and the pad, thereby assuring a high frequency response.

15 Claims, 6 Drawing Sheets

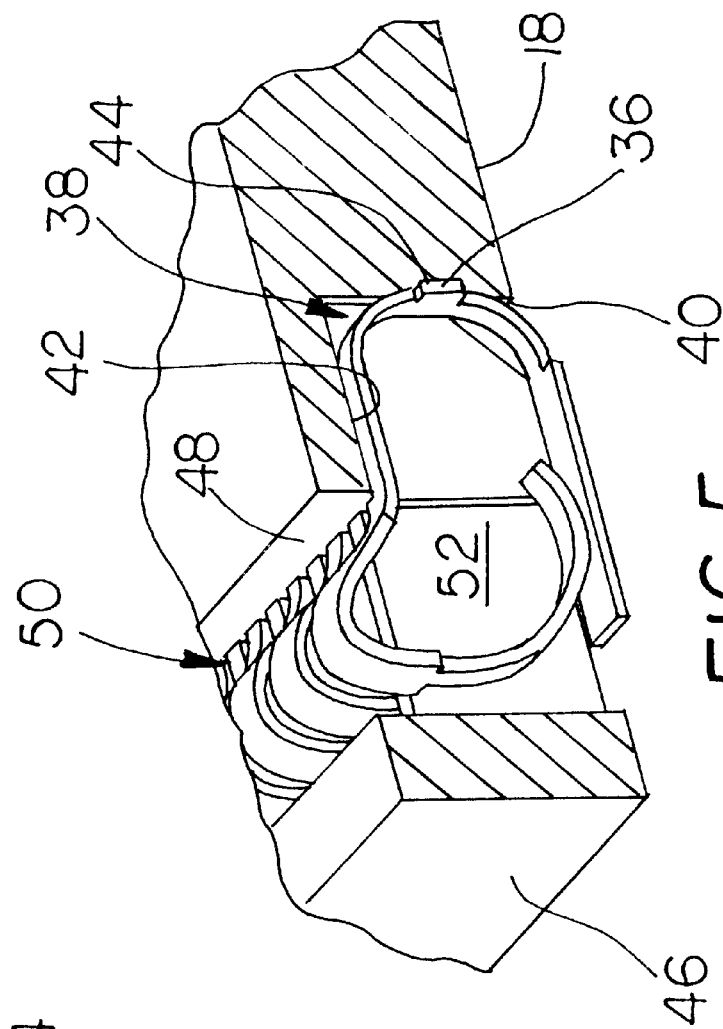
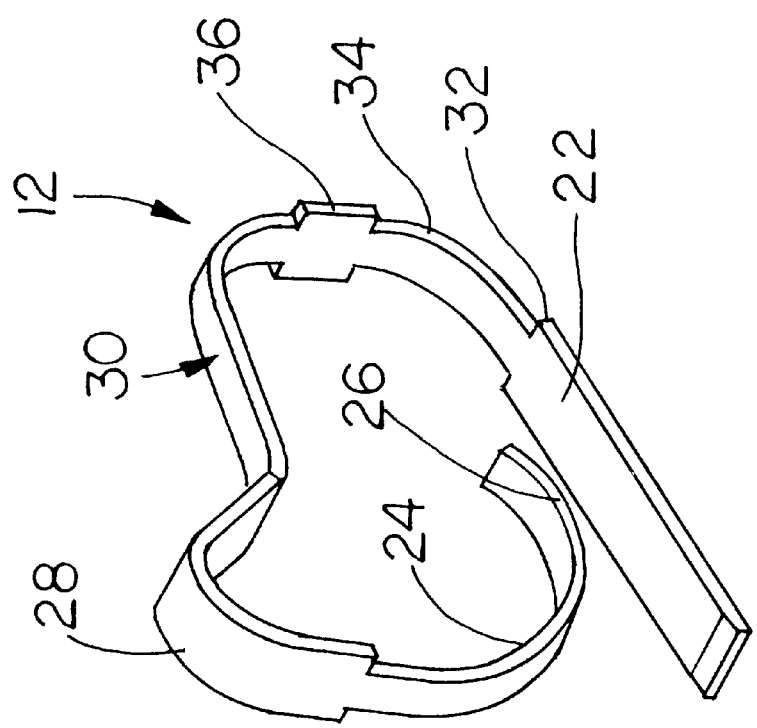
FIG. 5
FIG. 6

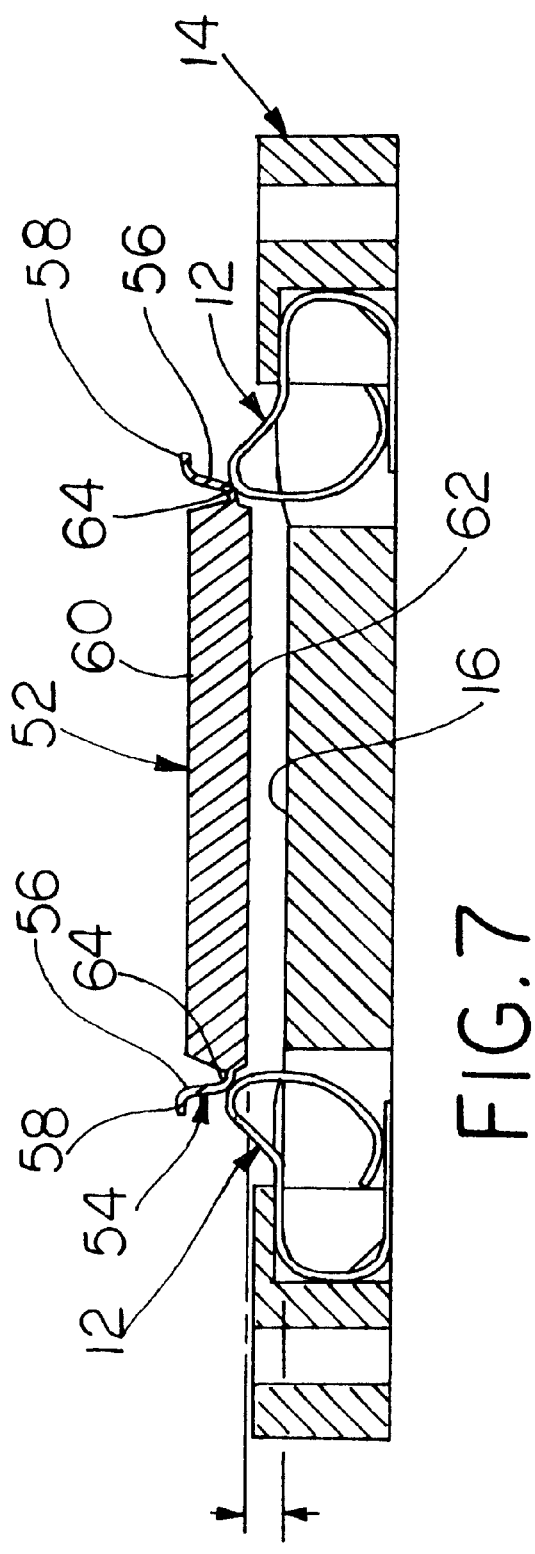
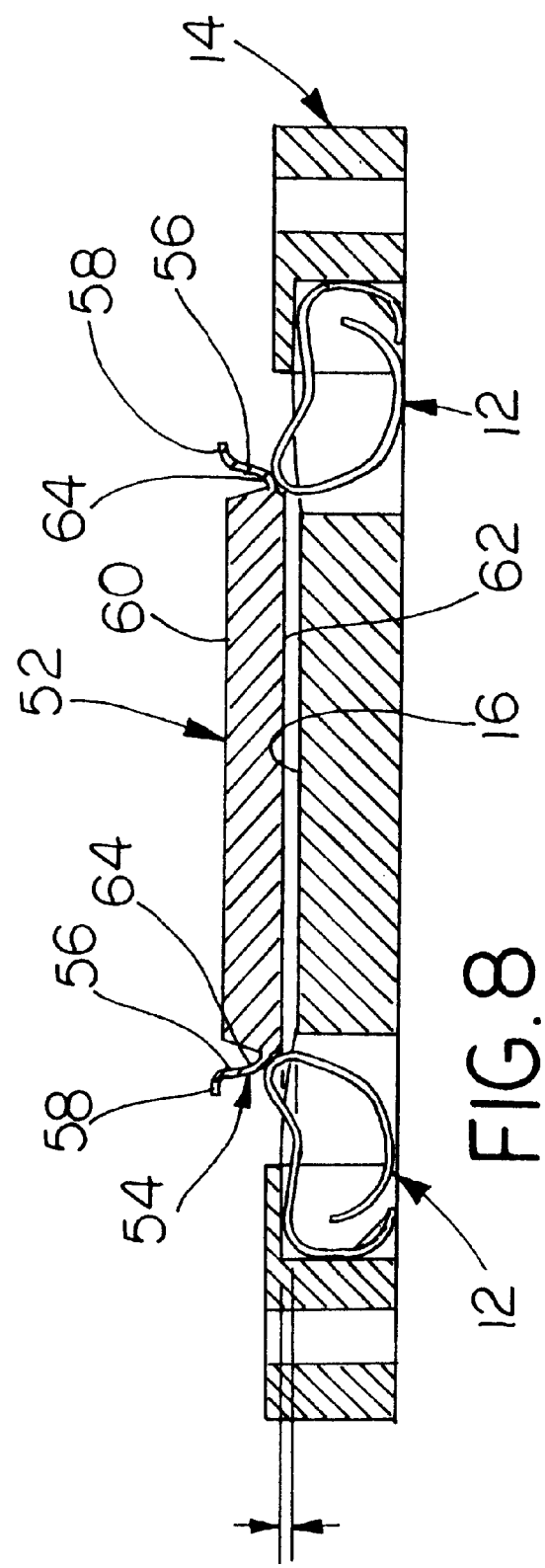

TEST CONTACTOR

This invention relates to a test contactor for establishing a releasable connection between terminals on electronic modules and a test fixture.

Electronic modules, such as microprocessors, integrated circuits, memory modules, etc. must be tested during the manufacturing process. These modules have multiple terminals, each of which must be connected to appropriate contacts on a printed circuit board incorporated as a part of the test fixture when the module is tested. It is desirable that the module be quickly connected and disconnected to the test fixture, since testing requires only a very brief connection time. Furthermore, to assure a high frequency response, the electrical path between the terminals on the module and the contacts on the printed circuit board should be minimized. It is also desirable that the module be able to be tested in both the normal orientation (referred to by those skilled in the art to the "live bug" orientation) or in an inverted orientation (referred to by those skilled in the art as the "dead bug" orientation).

According to the invention, a test contactor includes a housing which supports multiple looped contacts, one contact for each terminal of the electronic module. The contacts have a contact arm which is slidably engaged with a pad which engages the contacts on the circuit board. The contact is made out of resilient material, and when installed in the housing, the contact arm is deflected into engagement with the pad. Accordingly, when the contact area engaged by the terminals of the electronic module undergoing testing is deflected, the arm slides along the pad, and the resiliency of the contact immediately restores the contact when the electronic module is moved away from the contactor. Accordingly, the circuit path between the terminals and the pad through the contact arm is the shortest possible circuit path, thus assuring a high frequency response.

These and other advantages of the present invention will become apparent from the following description, with reference to the accompanying drawings, in which:

FIG. 5 is an enlarged view in perspective of the circumscribed portion of FIG. 2;

FIG. 6 is a view in perspective of the contact elements used in the test contactor illustrated in FIG. 1;

FIG. 7 is a transverse cross sectional view taken through the terminals of the test contactor illustrated in FIG. 1, but illustrating an electronic module being seated on the contact elements in the "dead bug" orientation; and FIG. 8 is a view similar to FIG. 7 but illustrating the test module being displaced relative to the test contactor.

Figure 1:
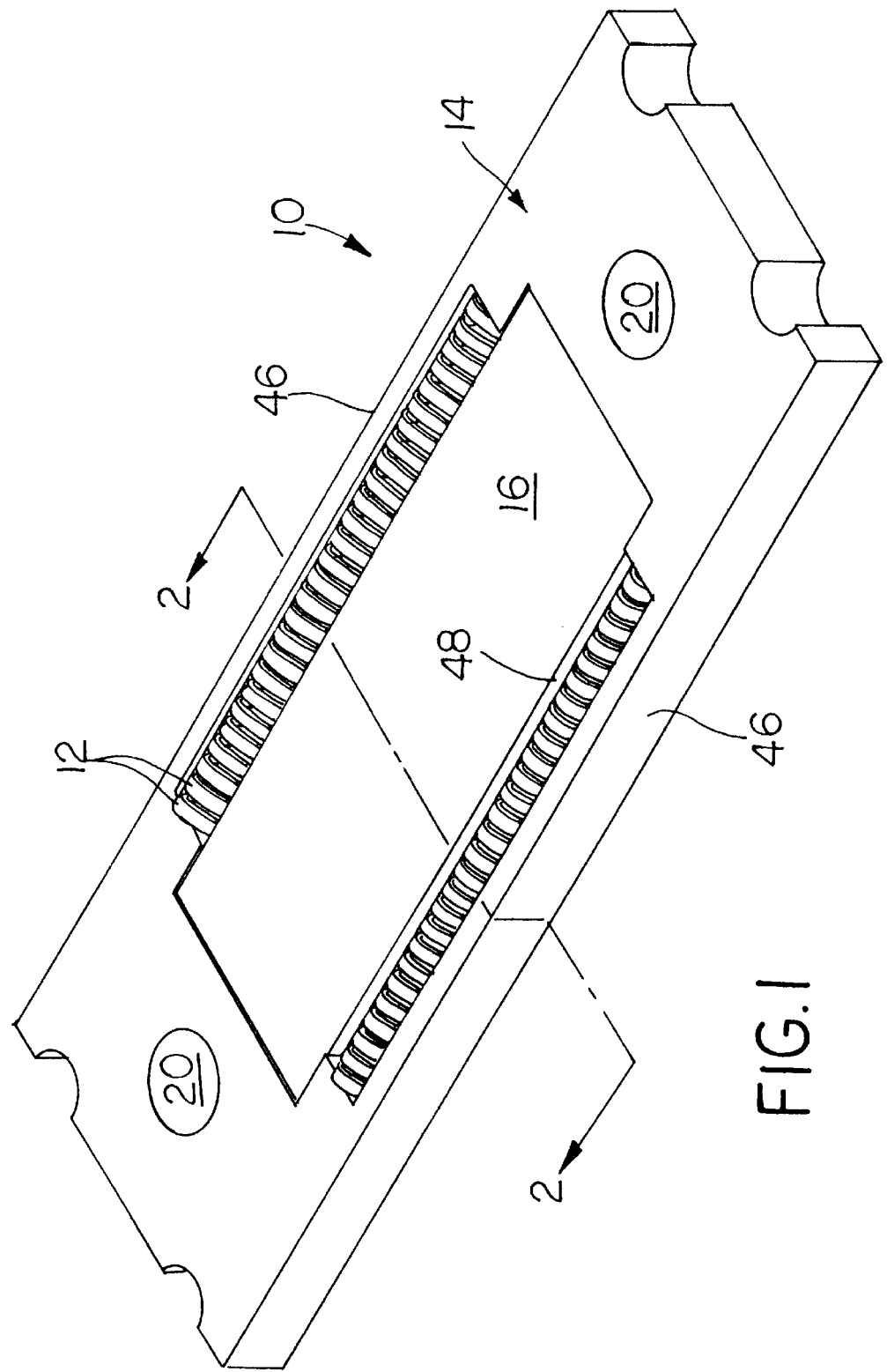
FIG. 1 is a view in perspective of a test contactor made pursuant to the teachings of the present invention.

Referring now to the drawings, a test contactor made pursuant to the teaching of the present invention is generally indicated by the numeral 10 and includes multiple, substantially identical contact elements 12 which are arranged in two rows and are carried by contactor housing 14 on opposite sides of a recessed test surface 16. Contactor housing 14 firther includes an engagement surface 18 which engages a circuit board (not shown) which is a part of the test fixture used to test electronic modules. The housing 14 is connected to the circuit board via use of appropriate fasteners (not shown) extending through openings 20.

Each of the contact elements 12 are identical and include a pad 22 which is adapted to engage the corresponding contacts on the circuit board (not shown), a spring arm 24, which includes a portion 26 that slidably engages the pad 22 when the contact element 12 is installed in the test contactor housing 14, a contact surface 28, from which the arm 24 extends, and a connecting portion 30, which forms a semicircle connecting the contact surface 28 and end 32 of the pad 22. The connecting portion 30 includes a curved section 34 which carries a barb 36. The connecting portion 30 of each contact element 12 is received within a downwardly facing, open sided slot 38 on opposite sides of engagement surface 18. The slot 38 is defined by a vertically extending edge 40 and a horizontally extending edge 42. Vertically extending edge 40 includes a recess 44 which receives the barb 36 with an interference fit, to thereby hold the contacts 12 onto the housing 14.

The test contactor housing 14 includes a pair of side rails 46 that cooperate with side edges 48 of the surface 16 to define a groove 50 therebetween through which the contact surfaces 28 of the contact elements 12 project. The contact surfaces project through the groove 50 to a height such that the contact surfaces 28 are above the level of the outer test surface 16. Partitions 52 extend through the slot 38 and across the groove 50 to connect with the rails 46, and are a part of the test contactor housing 14. The partitions 52 separate the contact elements 12 from one another.

As shown in FIG. 5, when the contact elements 12 are installed in the contactor housing 14 by installing the barb 36 in the recess 44, the sides 40, 42 of the slot 38 engages the connecting portion 30 of the contact elements 12, thus biasing the spring arm 24 and in particular the contact portion 26 thereof into sliding engagement with the pad 22 which, as discussed above, engages the corresponding contact portions of the circuit board. The contact portion 26 of spring arm 24 lightly engages the pad 22 at a point between the contact surface 28 and curved portion 34, so that the deflection of the contact surface causes the contact portion 26 to slide toward the curved portion 24. As also discussed above, when the contact elements 12 are installed in the slot 38, the contact surfaces 28 project above the level of the surface 16. The contact elements 12 are made of a resilient material, which automatically restores the contact elements to the shape illustrated in FIG. 5 after the contact surfaces have been deflected and then released.

Figure 2:
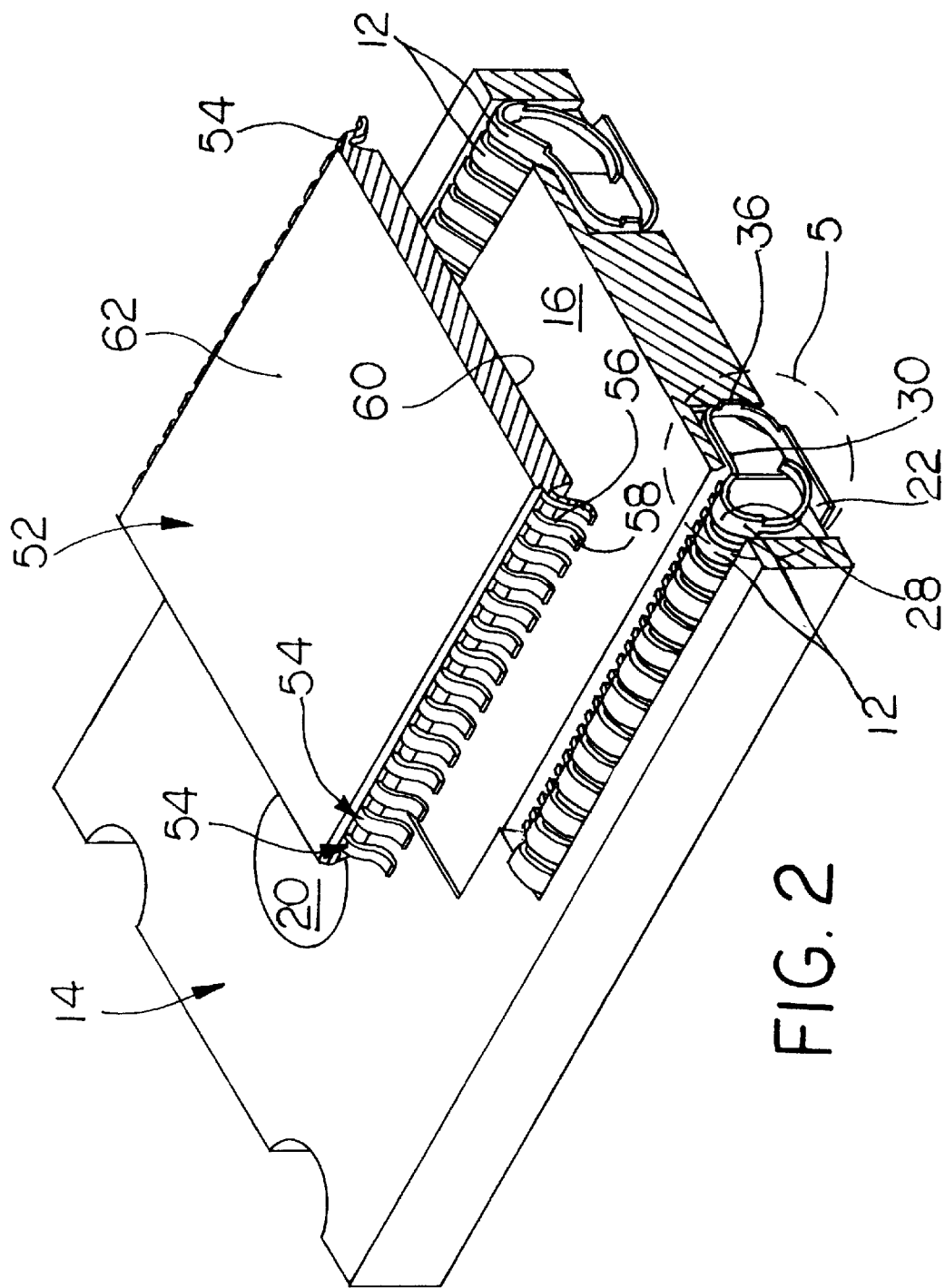
FIG. 2 is a cross section view in perspective taken substantially along lines 2—2 of FIG. 1, but showing the module to be tested displaced from the test contactor.
Figure 3:
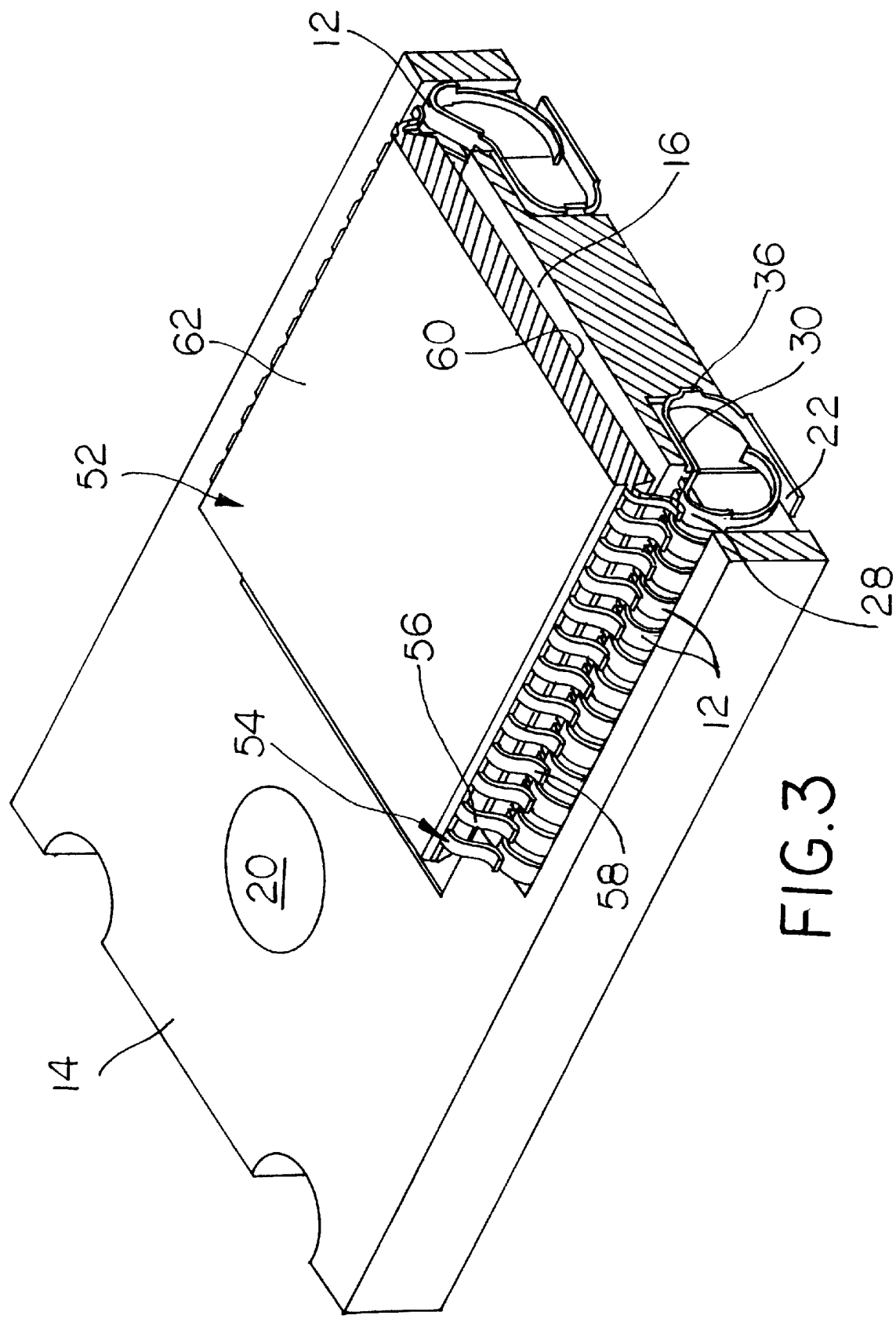
FIG. 3 is a view similar to FIG. 2, but illustrating the module to be tested resting on the contacts of the test contactor.
Figure 4:
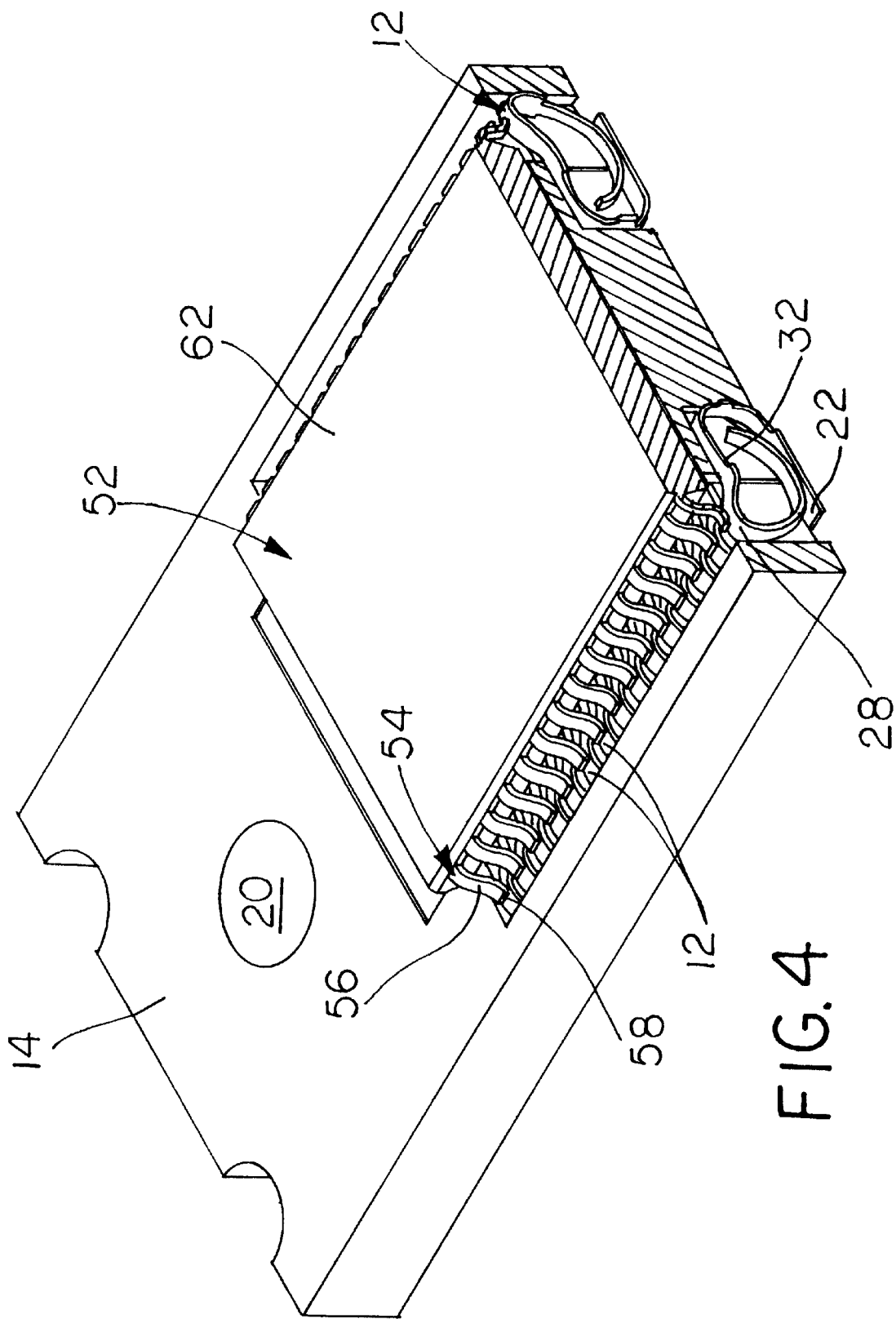
FIG. 4 is a view similar to FIGS. 2 and 3, but illustrating the test module fully seated and engaged on the test contactor.

Referring now to FIGS. 2–5, the electronic module to be tested is generally indicated by the numeral 52, and includes multiple terminals 54 along opposite sides thereof. Each of the terminals includes a downwardly curving portion 56 and an outwardly extending pad 58. It will be noted that the terminals 54 extend below the level of the lower surface 60 of the module 52. When the module 52 is to be tested, the module is positioned over the test surface 16 as illustrated in FIG. 2, and the terminals 54 are brought into engagement with the corresponding contact elements 12 as illustrated in FIG. 3. Accordingly, the terminals 54 make contact with the contact elements 12 before the lower surface 60 of the module 52 engages the surface 16 of the test contactor 10. As the surface 60 is brought into contact with the surface 16, as illustrated in FIG. 4, the terminals 54, due to the pressure applied therethrough to the contact surface 28 of the contact element 12 cause the latter to deflect downwardly. As the contact element 12 deflects downwardly, the contact portion 26 of the spring arm 24 slides along the pad 22, as illustrated in FIG. 4. Accordingly, an electrical connection is made between the terminals 54 and the circuit board (not shown) through the contact elements 12 as the module is moved from the FIG. 3 to the FIG. 4 position. When the module is removed, the contact elements 12 automatically restore themselves to their position illustrated in FIGS. 2 and 5 due to the resiliency of the contact elements. It will be noted that, during testing, two electrical paths are provided between the terminals 54 and the pad 22. One path is through the connecting portion 30, and the other path is through the sliding engagement of the spring arm 24 and the pad 22. It is desirable that the path between the terminal 54 and the contact area of the circuit board be as short as possible to assure the highest possible frequency response. This short path is provided through the spring arm 24 and the contact portion 26 of the spring arm 24.

The module 52 is illustrated in FIGS. 2–4 as being tested in its normal position in which the terminals 54 extend downwardly below the surface 60 thereof. This is referred to by those skilled in the art as the "live bug" orientation. However, it is also desirable to be able to test the module when the module is inverted, as illustrated in FIGS. 7 and 8, in which the upper surface 62 of FIGS. 2–4 is inverted and becomes the lower surface in FIGS. 7 and 8. As shown in FIGS. 7 and 8, the downwardly extending portions 56 of each of the terminals 54 include a knuckle 64 which projects outwardly from the module 52. Accordingly, when the module 52 is tested in the inverted or "dead bug" position illustrated in FIGS. 7 and 8, the knuckles 64 of the terminals 54 engage the contact surface 28 of the contact elements 12 thereby enabling testing of the module 52 in this orientation as well as the normal orientation illustrated in FIGS. 7 and 8.

What is claimed:

1. Test contactor for establishing a releasable connection between terminals of an electronic module to be tested and a circuit board connected to test equipment comprising a contactor housing having an outer surface, and a contact element carried by the housing for each terminal of the module, each said contact element having a pad for engagement with said circuit board, an arm slidably engaging the pad and having a projecting portion projecting above said outer surface, a contact surface on said projecting portion adapted for engagement with a terminal on said module, and a connection portion connecting said pad with said contact surface, said arm slidably engaging said pad between said contact surface and said connecting portion whereby said arm slides on said pad toward said connecting portion and said arm provides an electrical connection between the contact surface and said pad as the contact surface is deflected in response to engagement with the contact surface by a terminal of said module as the module is moved toward the outer surface.

2. Test contactor as claimed in claim 1, wherein said arm is a spring arm which yields in response to pressure applied thereto by engagement with a terminal during movement of the module toward said outer surface but restores to its initial state when the module is removed from the test contactor.

3. Test contactor as claimed in claim 1, wherein said connecting portion includes a barb, said housing having a recess receiving said barb whereby said contact element is secured to said housing by engagement of the barb in the recess.

4. Test contactor as claimed in claim 3, wherein said housing includes an engagement surface engaging said circuit board, said housing defining a slot in said engagement surface, said connecting portion being received in said slot, said recess being defined on a wall of said slot.

5. Test contactor as claimed in claim 4, wherein said outer surface is bounded by an outer edge, said slot extending through said edge, said connecting portion extending from said slot around said edge whereby said contact surface is positioned above said outer surface.

6. Test contactor as claimed in claim 5, wherein said slot is defined by an upwardly extending edge extending upwardly from said engagement surface and a transversely extending edge extending toward the outer edge of the outer surface from said upwardly extending edge, said pad being located within said slot, said transversely extending edge bearing against said connecting portion to bias the latter toward said pad to cause the connecting portion to bias the arm into engagement with said pad.

7. Test contactor as claimed in claim 6, wherein the recess receiving the barb is defined in said upwardly extending edge.

8. Test contactor as claimed in claim 1, wherein said pad, said connecting portion, said contact surface and said arm define a loop which extends from said pad to an engagement portion of the housing and then around an edge of said outer surface to support said contact surface above said outer surface and said arm extends from said contact surface back to said pad.

9. Test contactor as claimed in claim 8, wherein said loop extends into a slot defined within said housing, said slot having an upwardly extending edge extending upwardly from said circuit board and a transversely extending edge extending from said upwardly extending edge, the connecting portion of the loop extending into said slot, said transversely extending edge bearing against said connecting portion to bias the latter toward said pad to cause the connecting portion to bias the arm into engagement with said pad.

10. Test contactor for establishing a releasable connection between terminals of an electronic module to be tested and a circuit board connected to test equipment comprising a contactor housing having an outer surface, and a contact element carried by the housing for each terminal of the module, each said contact element having a pad for engagement with said circuit board, an arm slidably engaging the pad and having a projecting portion projecting above said outer surface and movable relative to the outer surface, a connecting portion connected to both the projecting portion and the pad, and a contact surface on said projecting portion and movable therewith relative to said outer surface for engagement with a terminal on said module, said arm sliding on said pad toward said connecting portion as said contact surface is moved toward the outer surface.

11. Test contactor as claimed in claim 10, wherein said arm is a spring arm which yields in response to pressure applied thereto by engagement with a terminal during movement of the module toward said outer surface but restores to its initial state when the module is removed from the test contactor.

12. Test contactor as claimed in claim 10, wherein said connecting portion includes a barb, said housing having a recess receiving said barb whereby said contact element is secured to said housing by engagement of the barb in the recess.

13. Test contactor as claimed in claim 10, wherein said pad, said connecting portion, said contact surface and said arm define a loop which extends from said pad to an engagement portion of the housing and then around an edge of said outer surface to support said contact surface above said outer surface and said arm extends from said contact surface back to said pad.

14. Test contactor as claimed in claim 13, wherein said loop extends into a slot defined within said housing, said slot having an upwardly extending edge extending upwardly from said circuit board and a transversely extending edge extending from said upwardly extending edge, the connecting portion of the loop extending into said slot, said transversely extending edge bearing against said connecting portion to bias the latter toward said pad to cause the connecting portion to bias the arm into engagement with said pad.

15. Test contactor as claimed in claim 14, wherein said connecting portion includes a barb, said upwardly extending edge having a recess receiving said barb whereby said contact element is secured to said housing by engagement of the barb in the recess.

* * * * *